United States Patent [19]

Havel et al.

[11] Patent Number: 4,811,421

[45] Date of Patent: Mar. 7, 1989

[54] TRANSMISSION POWER CONTROL DEVICE IN A RADIO COMMUNICATION TRANSMITTING/RECEIVING STATION

[76] Inventors: Christophe Havel, 6, mail R. Menand, 92130 Issy-Les-Moulineaux; Gérald Mazziotto, 7, rue Cadix, 75015 Paris, both of France

[21] Appl. No.: 25,804

[22] Filed: Mar. 12, 1987

[30] Foreign Application Priority Data

Mar. 14, 1986 [FR] France .................................. 86 03684

[51] Int. Cl.⁴ .............................................. H04B 1/00
[52] U.S. Cl. ........................................ 455/69; 455/67; 455/70; 455/116; 455/126; 379/58
[58] Field of Search ....................... 455/53, 54, 67, 68, 455/69, 70, 115, 116, 126, 127; 379/59, 60, 58

[56] References Cited

U.S. PATENT DOCUMENTS

| | | | |
|---|---|---|---|
| 3,732,496 | 5/1973 | Boyer | 455/69 |
| 4,165,493 | 8/1979 | Harrington | 455/115 |
| 4,392,245 | 7/1983 | Mitama | 455/69 |
| 4,613,990 | 9/1986 | Halpern | 455/69 |

Primary Examiner—John W. Caldwell, Sr.
Assistant Examiner—Tyrone Queen
Attorney, Agent, or Firm—Lowe, Price, Leblanc, Becker & Shur

[57] ABSTRACT

The power transmitted by an r.f. transmitting and receiving station, such as a mobile station, to a fixed base station, is controlled as a function of power received by the mobile station to obtain a constant receiving power level in the fixed station despite variations in the relative location of the stations. The power received by the mobile station is measured and sampled at predetermined instants. At each predetermined instant, the power to be received by the mobile station at a following predetermined instant is estimated as a function of the measured power, to derive an estimated power. R.f. signal power transmitted by the mobile station is reduced between the successive instants in proportion to the estimated power.

16 Claims, 3 Drawing Sheets

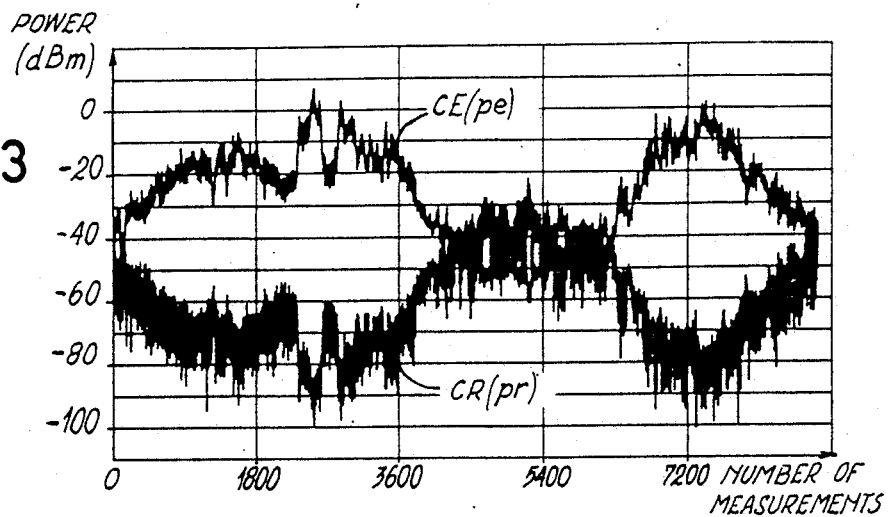
FIG. 3
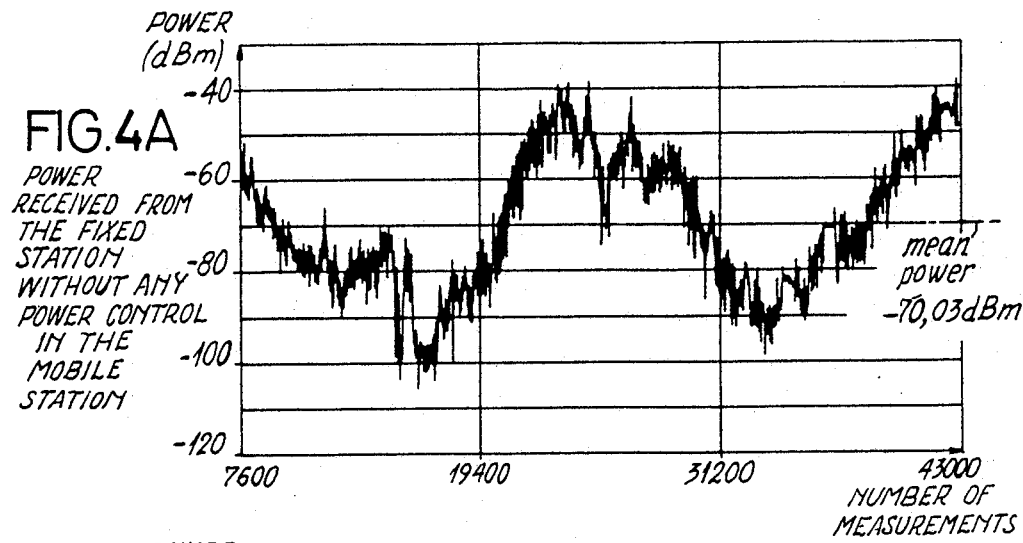
FIG. 4A POWER RECEIVED FROM THE FIXED STATION WITHOUT ANY POWER CONTROL IN THE MOBILE STATION
mean power −70,03 dBm
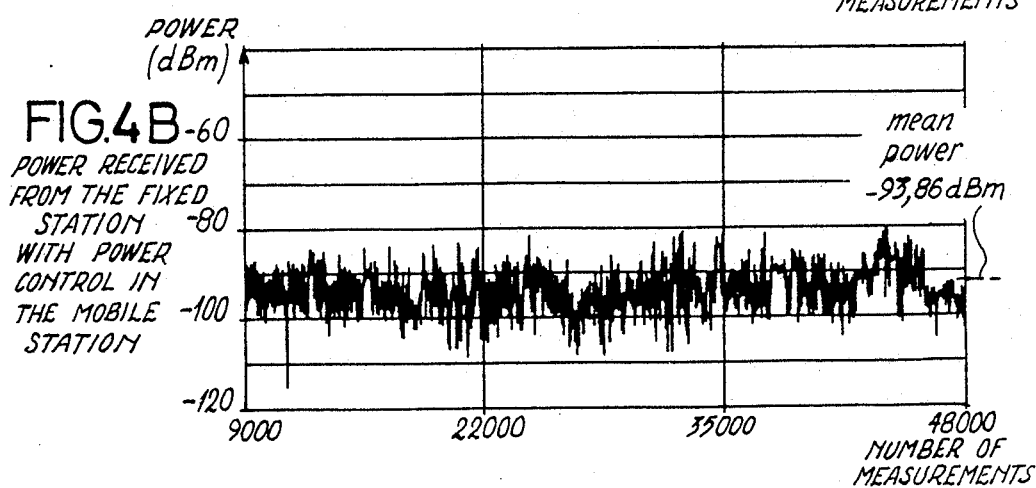
FIG. 4B POWER RECEIVED FROM THE FIXED STATION WITH POWER CONTROL IN THE MOBILE STATION
mean power −93,86 dBm

TRANSMISSION POWER CONTROL DEVICE IN A RADIO COMMUNICATION TRANSMITTING/RECEIVING STATION

BACKGROUND OF THE INVENTION

1. Field of the Invention

The present invention relates to a transmission power control device in a radio communication transmitting/receiving station particularly for mobile radio systems. The station is notably a mobile station of radio-telephone type on board a vehicle, designed to exchange information, such as voice and/or data messages, with a fixed base station in a telecommunication network operating along a known access process.

2. Description of the Prior Art

In r.f. communication systems with mobile stations, information exchanged between the fixed and mobile stations is transmitted bidirectionally through two radioelectric channels subject to fluctuations, which are to a great extent random. The fluctuations generally result from the combination of three factors:

attenuation due to the variable distance between the mobile and fixed stations, affecting the mean value of the power received in each station for a given distance;

relatively slow variations around the mean power value, due to masks or shadow regions on the radio electrical paths; and a rapid fluctuation in the signal received due to multiple paths, known as Rayleigh phenomenon, and practically entirely unforeseeable.

Generally, speaking, to ensure maximum power at the fixed station receiver, it is necessary to increase the rated power transmitted by the mobile station by a safety margin to cover the above fluctuations. To save as much of the energy available for transmitting radioelectric signals from mobile station, it is possible to control the power transmitted from the mobile stations to obtain a mean receiving level that is as constant as possible at the fixed station. The control device of the invention remedies the two first attenuation factors, and does not take into account the practically unforeseeable rapid Rayleigh fluctuations.

At the present time, to deal with fluctuations in the received signal, the received signal is generally corrected by automatic selective frequency equalization to remedy effects due to multipath fading, with automatic gain control (AGC) in a receiving amplifier to remedy the slow variations.

In certain radio communication systems each mobile station has several transmission power levels, and commutation is applied after the fixed station has detected saturation of the receive power level, or on the contrary a too low power level, so as to ensure correct receiving. The fixed station transmits a power commutation signal to the mobile station through a radioelectric signally channel. The power commutations are thus totally intermittent in the mobile station.

The aforesaid radio communication systems have a major drawback because, each mobile station communicating with the fixed station is in a different variable position. Thereby the propagation conditions differ from one location to the other, and the level of power received at the fixed station varies considerably according to the location of the mobile station. This makes receiving means in the fixed station more complex.

Moreover, as a safety measure, the mobile station transmits a power which is often well above that required to ensure correct receiving in the fixed station. This implies:

firstly an unnecessarily high energy consumption, which can be critical for a mobile station whose power resources are by their very nature highly limited;

secondly the superfluous power transmitted by the mobile station increases the noise level in the link to the fixed station; this may jam communications to other mobile stations in a service cell containing the fixed station.

OBJECT OF THE INVENTION

The main object of this invention is to provide a device for controlling, both continuously and independently, the power transmitted by a station, such as mobile station, from the power it has received, so as to obtain a constant mean receiving level in the other station, such as fixed base station, whatever the location of the mobile station within the service cell including the fixed station.

SUMMARY OF THE INVENTION

Accordingly a transmission power control device in the radio communication transmitting/receiving station comprises means for measuring the power of a signal received by the station at predetermined instants, means for estimating, as a function of the measured power, at each predetermined instant a signal power which will be received by the station at a following predetermined instant to thereby derive an estimated power, and means for controlling a signal power transmitted by the station between the successive instants in proportion to the estimated power.

As seen from the transmitting/receiving station, such as the mobile station, the mean power level with which the fixed station receives each of the signals transmitted by the mobile stations with which the fixed station dialogs, can be made equivalent. At each mobile station, the control device adjusts the transmission power level independently, without any information from the fixed station other than that of the mobile station deduced from the received power measurement.

According to other features of the invention, the estimating means computes the estimated power $pr^*_{t+T}$ which will be received at an instant $t+T$, as a function of signal power $pr^*_t$ received and measured at a predetermined instant $t$ and of the estimated power $pr^*_t$ of the aforesaid received and measured power $pr^*_t$, according to the following equation:

$$pr^*_{t+T} = pr^*_t + k(pr^*_t - pr^*_t)$$

where k is a factor less than 1, preferably approximately 0.25; the reducing means comprises variable gain amplification means for amplifying a constant power signal to be transmitted, and means for producing a gain control signal applied to the amplifying means, the gain control signal in decibels varying as a linear function of the estimated power. The control device thus produces a reduction in the transmitted power in relation to a rated constant power required to communicate at extreme range in the worst possible propagation conditions. This power reduction notably reduces the energy consumption in the station, such as the mobile station.

BRIEF DESCRIPTION OF THE DRAWING

Other features and advantages of the invention will be apparent from the following description of the preferred embodiments of the invention as illustrated in the corresponding appended drawings wherein:

FIG. 3 is a measurement diagram of powers received and transmitted by the station, such as a mobile station; and FIGS. 4A and 4B are measurement diagrams of power received in a station, such as a fixed station, in communication with the mobile station, not equipped and equipped with a power control device, respectively, for a same run of the mobile station.

DESCRIPTION OF THE PREFERRED EMBODIMENTS

Figure 1:
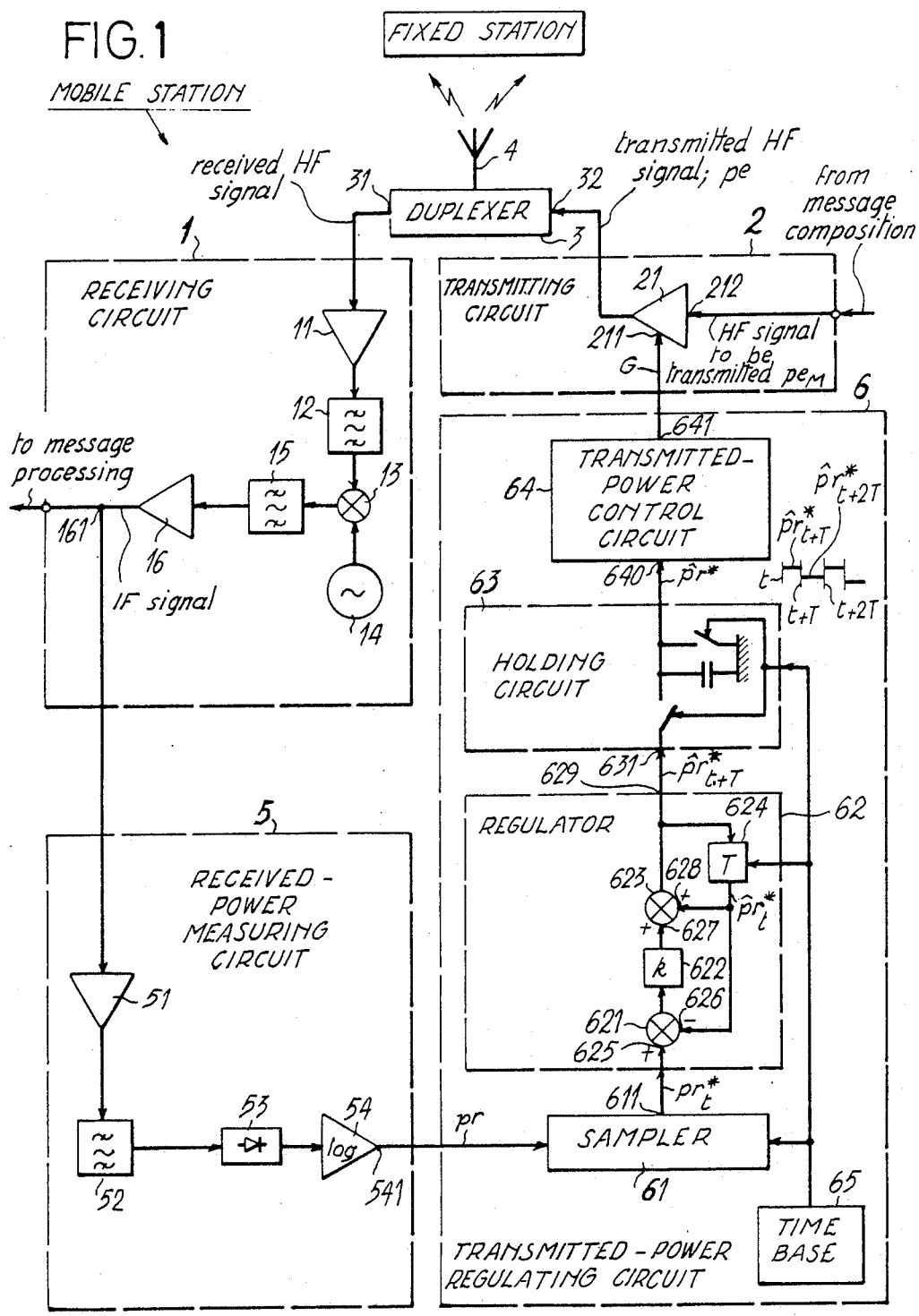
FIG. 1 is a schematic block diagram of a transmission power control device in a radio communication transmitting/receiving station.

As shown in FIG. 1, a mobile station in a radio communication system contains a receiving circuit 1 and a transmitting circuit 2 connected respectively to output 31 and output 32 of a hyperfrequency duplexer 3 supplying a bidirectional antenna 4.

The receiving circuit 1 transposes a high frequency signal received by the antenna 3 and duplexer 32 and transmitted, typically in a narrow frequency band with central frequency 900 MHz, from a fixed base station in the radio communication system, into an intermediate frequency signal IF of 70 MHz. Circuit 1 comprises, as from output 31 of the duplexer, a high frequency preamplifier 11, a narrow-band band-pass filter 12, a mixer 13 connected to outputs of the filter 12 and a local oscillator 14, and a band-pass filter 15 and an amplifier 16 respectively filtering and amplifying the intermediate frequency signal IF outgoing from the mixer. The IF signal delivered from an output 161 of amplifier 16 is applied firstly, to the input of a received-power measuring circuit 5, secondly, to known means included in the mobile station for demodulating the IF signal and processing messages included in this signal and produced from the fixed station.

The measuring circuit 5 together with a transmitted-power regulating circuit 6 are the main components of a transmission power control device embodying the invention.

The received power is measured on the intermediate frequency signal IF obtained after transposing the high frequency signal received. The measuring circuit 5 includes, series-connected from output 161 of the intermediate frequency amplifier, an amplifier 51, a band-pass filter 52, a peak detector 53 detecting the envelope of the IF signal, and a logarithmic amplifier 54. Amplifier 54 transforms into decibels the instantaneous received power pr corresponding to that of the IF signal. An exemplary trend of the power (pr) in the received signal on output 541 of amplifier 54 is shown by a curve CR in FIG. 3 and corresponds to power measurements made during the movement of the mobile station.

The regulating circuit 6 includes, series-connected from output 541 of largithmic amplifier 54, a sampler 61, a power regulator 62, a voltage holding circuit 63, a transmitted-power control circuit 64 and a time base 65. As will be seen subsequently, an output 641 of the control circuit 64 delivers a gain control signal G to a gain control input 211 of a variable gain power amplifier 21 included in the transmitting circuit 2 so as to control the power of a high frequency signal to be transmitted to the fixed station. The HF signal to be transmitted with a constant pe$_M$ is applied to an input 212 of amplifier 21 by known means included in the mobile station for composing messages to be transmitted to the fixed station, for intermediate frequency modulating them and for high frequency transposing them. The signal to be transmitted, suitably amplified, is applied by amplifier 21 to input 32 of duplexer 3.

Time base 65 supplies a clock signal at period T to sampler 61, to a delay circuit or line 624 included in regulator 62 and to holding circuit 63. In practice, time base 65 is common to the message processing and composing means already referred to, and can include a programmable frequency divider for supplying a clock signal having a period T varying as a function the speed of movement of the mobile station; for example, when the mobile station is on board a vehicle, the frequency divider is programmed by a movement sensor, such as a tachometer, or is replaced by this sensor, so as to provide a clock pulse on average every 100 milliseconds for an average amount of the mobile station having a predetermined length of about 1 meter, i.e., a speed of 10 m/s. When the period T of the clock signal is not programmable, it is equal to or less than about 1 second. Thus, the power signal pr received an output 541 of the logarithmic amplifier is sampled in sampler 61, and an output 611 of sampler 61 delivers to regulator 62 power received samples pr*$_t$, pr*$_{t+T}$, pr*$_{t+2T}$, ... at successive predetermined instants t, t+T, t+2T.

The task of regulator 62 is to estimate at the beginning time t of a sampling period T, a power pr*$_{t+T}$ which will be received and sampled at the beginning time t+T of the next period depending on the power pr*$_t$ received and sampled at instant t, so as to supply an estimated power pr*$_{t+T}$ that controls the transmission power in amplifier 21 during the sampling period T. A theoretical study checked by measurements indicates that the prediction of received power provided by the equation below was satisfactory:

$$pr^*_{t+T} + pr^*_t + k(pr^*_t)$$

where the sign denotes the estimation function and k denotes a constant predetermined factor less than 1. The theoretical study, completed by a statistical simulation study with values of parameters k and T, chiefly in an urban environment where the effects of the mask or shadow region are frequent, has shown that the regulator performance depends very little on the factor k and that is is not necessary to adapt the factor k permanently to the conditions of movement of the mobile station and the conditions of propagation of radioelectric waves.

For sampling at mean period T=100 ms and an average speed of movement of the mobile station of 10 m/s, factor k is chosen at approximately 0.25, to obtain a practically constant reception power in the fixed station, as shown in FIG. 4B. In FIG. 4A is shown measurement results of power received by the fixed station when the mobile station is not equipped with a transmission power control device embodying the invention. The results of FIG. 4A are in contrast to those of, FIF. 4B, corresponding to measurements for the same run covered by the mobile station. The comparison indicates the constancy of the power received in the fixed station via the control device. According to the aforesaid studies, factor k is obtained from the following formula established from statistical formatting of the propagation conditions:

$$k=a/(1+2\sigma^2_W/(\sigma^2_B+(\sigma^4+4\sigma^2_B\sigma^2_W)^{\frac{1}{2}}))$$

where a is a factor of around 1, $\sigma^2_W$ a white noise variance of around 40 corresponding to rapid fluctuations due to multiple paths, and $\sigma^2_B$ a white noise variance of around 3.5 depending on slow fluctuations due to masks. Thus, the predetermined constant K is a function of receiver station sensitivity and/or transmission power margin to protect against fading.

As shown schematically in FIG. 1, the aforesaid power equation is obtained in regulator 62 via a substractor circuit 621, a multiplying-by-k circuit 622, and an adder circuit 623 and a delay circuit 624 imposing a delay of T. Substractor circuit 621 receives via a direct input 625 the received power sample $pr^*_t$, and via inverting input 626 the received power sample $pr^*_t$ estimated at the beginning t−T of the previous clock period, and delivers a power sample difference $pr^*_t - pr^*_t$ to an input of circuit 622. The multiplying circuit 622 applies a product $k(pr^*_t - pr^*_t)$ to a first input 627 of adder circuit 623 to be added to the power estimated sample $pr^*_t$ so as to deliver an estimated power sample $pr^*_{t+T}$ to output terminal 629. The output terminal 629 is connected to input 626 of the subtractor circuit and to second input 628 of the adder circuit through the delay circuit 624 delivering the sample $pr^*_{t+T}$ at the beginning of the next sampling period corresponding to the receiving of the next sample $pr^*_{t+T}$. The delay circuit 624 thus memorizes or stores the estimated power $pr^*_{t+T}$ between the successive instants t and t+T.

In practice regulator 62 can be produced in either digital or analog form.

Figure 2A:
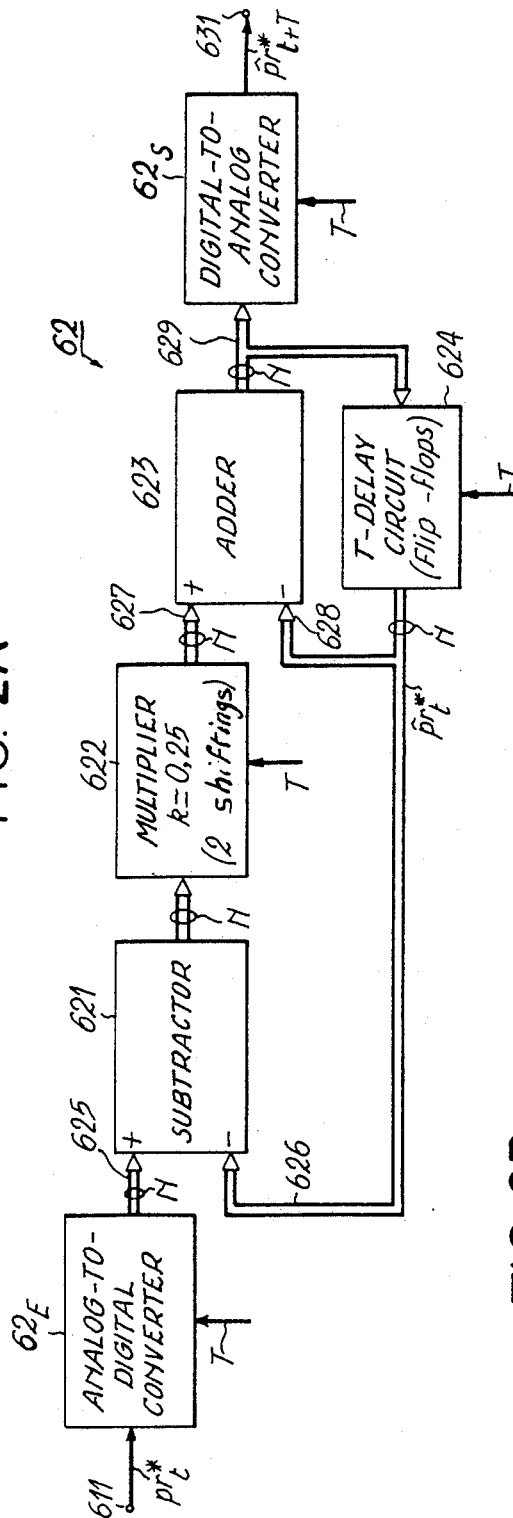
FIGS. 2A and 2B are digital and analog circuit diagrams of first and second power regulators included in the control device, respectively.

As shown in FIG. 2A, the digital regulator includes, input between terminals 611 and 625, an analog-to-digital converter $62_E$, responsive to the measured analog power signal $pr^*_t$, and digital-to-analog converter $62_S$ for supplying holding circuit 63 with estimated received analog power signal $pr^*_{t+T}$ via terminal 631. Converter $62_E$ and $62_S$ are controlled by the clock signal T produced by time base 65. The input converter $62_E$ converts each analog sample $pr^*_t$ into a sample word having a predetermined number N of parallel bits, whereas converter $62_S$ converts a sample word having N-bits produced by the adder circuit 623 into an analog sample $pr^*_{t+T}$. The links between the other logic circuits 621 to 624 are N-wire buses. According to the embodiment shown in FIG. 2A, circuits 621 and 623 are respectively conventional a logic gate subtractor and adder. The multiplying circuit 622 is a shift register with two-stage shift operation during each period T to obtain a division by $2^2=4$ when k=0.25. The delay circuit 624 includes N buffer flip-flops to memorize or store the sample $pr^*_{t+T}$ between instants t and t+T.

Figure 2B:
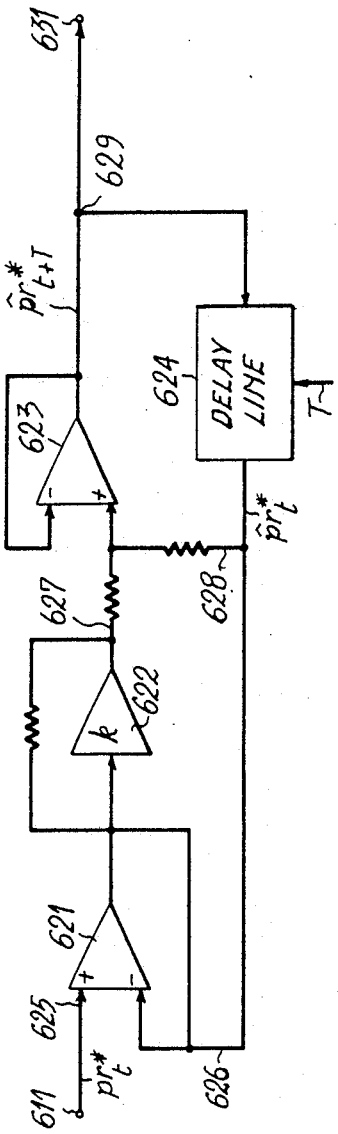

According to FIG. 2B, the analog structure regulator contains three operational amplifiers 621, 622 and 623, operating respectively as a subtractor, a k gain amplifier and an adder. Circuit 624 is a programmable delay line imposing a delay T, for example, by means of a series of monostable flip-flops.

Referring once again to FIG. 1, holding circuit 63 includes, in a known way, a capacitor, means for rapidly loading and discharging the capacitor at the beginning and end of period T by a constant voltage proportional to the sample of estimated power $pr^*_{t+T}$ between instants t and t+T and applied to an input of 640 of the transmitted power control circuit 64. Thus, more generally the voltage at input 640 is an intermittent voltage having constant increments proportional to the samples of estimated power $pr^*_{t+T}, pr^*_{t+2T}, \ldots$ during the time intervals (t, t+T), (t+T, t+2T), . . . .

If the power applied to input 212 of transmission circuit 2 is designated by $pe_M$, it is transmitted by amplification circuit 21 with a gain G in decibels. In the most unfavorable conditions, when the received power pr is below a predetermined receiving threshold, the gain is maximum and is equal to $G_{max}=p_0-pe_M$, where $p_0$ designates the rated power of the mobile station transmitter. The receiving threshold retrieves the sensitivity $p_m$ of the mobile station receiving circuit and a power margin MA designed to protect against fading, typically equal to 20 db. On the contrary, when the power received pr is high and tends towards a predetermined value, the gain G is minimum. The power to be transmitted pe on output from amplification circuit 21 is shown graphically by curve CE in FIG. 3 and is in all cases:

$$pe=pe_M+G=p_0+p_m+MA-pr$$

The gain G can be written as follows:

$$G=p_0-pe_M+p_m+MA-pr=G_{max}+p_m+MA-pr$$

The aforesaid powers are expressed in dBm and the aforesaid gains in dB.

The "mirror" effect between curves CE and CR in FIG. 3 is characteristic of regulator 62 with rapid fluctuation smoothing on transmission.

The control circuit 64 is thus designed to establish the gain G in decibels of amplification circuit 21 during each sampling period T as a function of the respective sample of estimated received power $pr^*_{t+T}$. For example, if the control of the transmitted power pe is obtained in amplification circuit 21 by switching-over attenuators connected selectively to the input of an amplifier, control circuit 64 consists in driving these attenuators on dependance of the computed value $G_{max}-G$, meaning attenuation $A=pr-(p_m+MA)$, i.e., contingent on the value of the estimated received power from which a constant value is substracted, the amplifier having a gain $G_{max}$.

When the regulator is in the form of digital circuits, as shown in FIG. 2A, the gain control can be obtained as follows. The digital-to-analog converter $62_S$ is eliminated, and a buffer memory, acting as holding circuit 63, is driven by the time base 65 and connected to output 629 of the regulator. At the buffer memory, a subtractor included in circuit 64 subtracts a constant number $(P_m+MA)$ from the estimated received power $pr^*$ read periodically in the memory to produce value A. The digital value A is used directly, or possibly after encoding, to switch, in amplification circuit 21, attenuators placed on input to gain $G_{max}$ amplifier.

Thus it appears globally that the transmitted power pe is independent of any established characteristics in the fixed station, whereby power regulation can be obtained without having recourse to transmission of special information from the fixed station to the mobile station.

Although the invention has been described according to a preferred embodiments, it should be observed that a digital regulator can be obtained by a microprocessor designed for other tasks, chiefly when voice and/or data messages processing and composing means are digital type.

Moreover a control device embodying the invention can be contained in the fixed station.

Furthermore the invention can be used whatever the known radio communication access process used, such as time division multiple access (TDMA) or frequency division multiple access (FDMA) with or without dynamic allocation of time or frequency channels, or such as code division multiple access (CDMA). It should be observed that, when mobile stations are provided with control devices embodying by the invention, it is no longer necessary to adapt the gains of the receivers in the fixed station respectively contingent on the powers received in the time channels for a TDMA, or in the frequency channels for a FDMA, assigned to the mobile stations, whereby jamming between adjacent channels can be considerably reduced.

What we claim is:

1. A transmission power control device in a radio communication transmitting and receiving station, comprising:

means for measuring power of a signal received by said station at predetermined instants, means for estimating at each predetermined instant a signal power which will be received by said station at a next predetermined instant, as a function of said measured power, thereby producing an estimated power, said estimating means comprising subtractor means for computing a difference in said measured signal power received at a predetermined instant and the estimated power of the received and measured power, means for multiplying a power difference by a predetermined factor less than 1, thereby deriving a product, adder means for adding said product of said power difference and said factor to said estimated power of the received and measured power so as to establish said estimated power of the power which will be received and measured at the next instant, and means for memorizing said next instant estimated power during a time interval between the two instants, thereby applying it to said adder and subtractor means at said next instant, and means for reducing a signal power transmitted by said station between successive instants, in proportion to said estimated power.

2. The device claimed in claim 1, wherein said estimating means computes said estimated power $(pr^*_{t+T})$ which will be received at an instant $t+T$, as a function of the received signal power $(pr^*_t)$ measured at a predetermined instant t and as a function of the estimated power $(pr^*_t)$ of said received and measured power $(pr^*_t)$, according to the following equation:

$$pr^*_{t+T} = pr^*_t + k(pr^*_t - pr^*_t)$$

where k is a factor less than 1, and T denotes a time interval between two successive instants.

3. Apparatus for controlling the amplitude of a signal transmitted from a communication transmitting and receiving station comprising:

means responsive to a signal received by the station for deriving a first signal having a value representing the magnitude of power of the received signal, means responsive to the value of the first signal at successive spaced intervals t, t+T, etc, for deriving a signal having values representing estimates of the power of the signal to be received by the station at successive spaced intervals t+T, t+2T, etc, said means for deriving a signal representing estimates of the signal to be received including computer means for:

(a) combining the first and estimate representing signals to derive a second signal having a value representing the difference between the values of the first and estimate representing signals, (b) multiplying the second signal by a constant having a value between zero and one, to derive a third signal, (c) combining the estimate representing and third signals to derive a fourth signal having a value representing the sum of the values of the estimate representing and third signals, the fourth signal having a value representing the estimates of the power of the signal to be received by the station at successive spaced intervals t+T, t+2T, etc.; and means responsive to the value of the fourth signal for controlling the amplitude of the signal transmitted by the station between the successive intervals t+T, t+2T, etc.

4. The device claimed in claim 1, wherein said estimating means includes digital circuits having input means for digitally converting said received signal power, and output means for analogically converting said estimated power.

5. The device claimed in claim 1, wherein said estimating means includes analog circuits.

6. The device claimed in claim 1, wherein said predetermined instants are periodic.

7. The device as claimed in claim 1, comprising tachometric means for supplying clock pulses marking said predetermined instants in response to movements of said station having a predetermined length, said clock pulses being applied to said estimating means and said reducing means.

8. The device as claimed in claim 1, wherein said measuring means comprises means for transposing a high frequency signal received by said station into an intermediate frequency signal, means for producing a power signal in proportion to the instantaneous power of said intermediate frequency signal, and means for connecting said produced power signal at said predetermined instants into received power samples applied to said estimating means.

9. The device claimed in claim 8, wherein said power signal producing means further comprises a peak detector series-connected to a logarithmic amplifier.

10. The device as claimed in claim 1, wherein said reducing means comprises variable gain amplification means for amplifying a constant power signal to be transmitted and means connected to said estimating means for producing a signal controlling the gain of said amplification means, said gain controlling signal varying as a linear function of said estimated power.

11. The device claimed in claim 1, wherein said reducing means comprises means for attenuating a predetermined power signal to be transmitted as a function of a variable attenuatin less than a predetermined constant gain thereby deriving an attenuated signal, means for amplifying said attenuated signal with said constant gain, and means controlling said attenuating means for establishing said variable attenuation as a function of the difference between said estimated power and a predetermined constant.

12. The device claimed in claim 11, wherein said predetermined constant is a function of a receiving sensitivity of said station and/or a transmission power margin protecting against fading.

13. The device claimed in claim 11, wherein said variable attenuation establishing means comprises means for producing a voltage varying according to an intermittent constant incremental function of said estimated power, each voltage increment lying between two successive predetermined instants and proportional to the estimated power at the first of said two successive instants, and means for subtracting from each voltage increment, a voltage proportional to said predetermined constant.

14. In a radio communication transmitting and receiving station, means for receiving a radio frequency signal having variable power, means for measuring power of the signal received by said receiving means at predetermined instants thereby producing analog power samples at said predetermined instants, first means for converting said analog power samples into digital power words, digital means connected to said first converting means for deriving a digital estimated power word at each of said predetermined instants, the estimated power word at a first predetermined instant being representative of a power sample which will be produced at a second predetermined instant succeeding said first instant and being derived as a function of said digital power word provided by said first converting means at said first instant, second means for converting the digital estimated power words into analog estimated power samples, and means receiving a signal derived by said station and to be transmitted in the form of a radio frequency signal by said station for reducing the power of said derived signal in response to and in proportion to said analog estimated power samples.

15. The station of claim 14, comprising a digital subtractor for computing a difference word between the digital power word delivered from said first converting means at said first instant and a digital estimated power word derived by said deriving means at a predetermined instant preceding said first instant, a digital multiplier for multiplying said difference word by a digital predetermined factor thereby deriving a product word, a digital adder for adding said product word to said digital estimated power word derived at said preceding instant to derive an estimated power word to be applied to said second converting means, and a digital delay circuit for applying said estimated power word provided by said adder to said substractor and said adder at said second instant.

16. A method of controlling the amplitude of a signal transmitted from a communication transmitting and receiving station comprising:
deriving a first signal having a value representing the magnitude of power of a signal received by the station, responding to the value of the first signal at successive spaced intervals t, t+T, etc. to derive a signal having values representing estimates of the power of the signal to be received by the station at successive spaced intervals t+T, t+2T, etc., the signal representing estimates of the signal to be received being derived by deriving a second signal having a value representing the difference between the values of the first and estimate representing signals, multiplying the value of the second signal by a constant having a value between zero and one to derive a third signal, deriving a fourth signal having a value representing the sum of the values of the estimate representing and third signals, the fourth signal having a value representing the estimates of the power of the signal to be received by the station at successive spaced intervals t+T, t+2T, etc., and controlling the amplitude of the signal transmitted by the station between the successive intervals t+T, t+2T, etc. as a function of the value of the fourth signal.

* * * * *